United States Patent
Saeki

[11] Patent Number: 5,742,194
[45] Date of Patent: Apr. 21, 1998

[54] INTERNAL CLOCK GENERATOR FOR A SYNCHRONOUS DYNAMIC RAM

[75] Inventor: Takanori Saeki, Tokyo, Japan

[73] Assignee: NEC Corporation, Tokyo, Japan

[21] Appl. No.: 615,824

[22] Filed: Mar. 14, 1996

[30] Foreign Application Priority Data

Mar. 14, 1995 [JP] Japan ................................. 7-053889

[51] Int. Cl.⁶ .................................................. H03K 5/13
[52] U.S. Cl. ............................................ 327/298; 327/291
[58] Field of Search ................................... 327/291, 292, 327/293, 295, 296, 298, 299

[56] References Cited

U.S. PATENT DOCUMENTS 5,396,111  3/1995  Frangioso et al. ............... 327/295

FOREIGN PATENT DOCUMENTS 1-68016    3/1989   Japan ............................. 327/291
1-268309   10/1989  Japan ............................. 327/291
3-58612    3/1991   Japan ............................. 327/291
6-290583   10/1994  Japan .
7-65574    3/1995   Japan .

OTHER PUBLICATIONS

Saeki et al., "SP 23.4: A 2.5ns Clock Access 250MHz 256Mb SDRAM with a Synchronous Mirror Delay", 1996 IEEE International Solid–State Circuits Conference, pp. 374–375.

Primary Examiner—Timothy P. Callahan
Assistant Examiner—T. T. Lam
Attorney, Agent, or Firm—Foley & Lardner

[57] ABSTRACT

A first signal $\phi 1$ is produced from an external clock CLK. A second ond signal $\phi 2$ is produced from a clock enabling signal CKE for controlling an internal clock of a SDRAM. A phase compensated signal $\phi 3$ is produced by advancing the phase angle of the signal $\phi 1$. A control signal $\phi 4$ is produced by a D-type flipflop from the signals $\phi 1$ and $\phi 2$. A phase-advanced internal clock $\phi 6$ is produced from the signals $\phi 3$ and $\phi 4$ through an RS-type flipflop and an OR gate. The phase-advanced internal clock $\phi 6$ thus has no error producing waveform.

8 Claims, 12 Drawing Sheets

INTERNAL CLOCK GENERATOR FOR A SYNCHRONOUS DYNAMIC RAM

BACKGROUND OF THE INVENTION

The present invention relates to a control system for a synchronous dynamic RAM (SDRAM), and more particularly to an internal clock generator of a SDRAM.

Control signals for a SDRAM are synchronized to its internal clock, and data input-output is also performed synchronized to the internal clock. As one of the features of a SDRAM, the internal clock frequency is to be easily changed according to operational speeds of output devices, for example, even when data are consecutively read out in a burst operation.

Various proposals have been disclosed for simplifying the application of the SDRAM.

For example, in a Japanese patent application entitled "Synchronous Type Semiconductor Memory" and laid open as a Provisional Publication No. 290583/'94, an internal clock generator shown by FIG. 8 has been disclosed. In the prior art, an external system clock CLK 101 is received by a first primary stage circuit 103, which is controlled by a clock enabling signal CKE 102 received by a second primary stage circuit 104 for matching operational speed of a SDRAM to output devices or for providing a power save operation of a SDRAM.

FIG. 9 shows a circuit diagram of the first or the second primary stage circuit 103 or 104. In FIG. 9, p-channel transistors Q3, Q4 and n-channel transistors Q5, Q6 constitute a conventional mirror circuit. When an enabling signal φe is at logic HIGH, the p-channel transistors Q1 and Q2 are OFF, and the n-channel transistor Q9 is ON, making the logic of the output signal φout at LOW regardless of an input signal φin. When the enabling signal φe is at logic LOW, the p-channel transistors Q1 and Q2 are ON, and the n-channel transistor Q9 is OFF enabling the mirror circuit. The logic of the signal φout is an inverted logic of the input signal φin, determined by comparison with a reference signal φr by the mirror circuit.

FIG. 11 shows signal waveforms in the internal clock generator of FIG. 8. The waveform of a first signal φ1 output of the first primary stage circuit 103 is similar to that of the CLK 101, inverted and delayed by a circuit operational delay, and the waveform of a second signal φ2 output of the second primary stage circuit 104 is similar to that of the CKE 102, inverted and delayed by the circuit operational delay. A first control circuit 502 consisting of a D-type flipflop 502a and a D-type latch 502b as shown in FIG. 10, stores logic of the second signal φ2 at each rising edge of the first signal φ1, latches the stored signal at the succeeding falling edge of the first signal φ1 and holds the latched signal until the next falling edge. Thus, a control signal φ54 is output of the first control circuit 502 as shown by a waveform φ54 in FIG. 11.

A second control circuit 508 of the prior art suppresses the first signal φ1 during logic HIGH of the control signal φ54 to be output as an internal clock φ56.

Thus, an internal clock having a waveform as shown by φ56 in FIG. 11 is obtained from output of the second control circuit 508, suppressed with logic LOW of the asynchronous clock enabling signal CKE 102 making an effective clock period elongated.

The primary stage circuit shown by FIG. 9 with a current mirror is excellent as a high speed and small amplitude signal interface, but somewhat dissipative.

In another Japanese patent application entitled "Primary Stage System for Semiconductor Memory" and laid open as a Provisional Publication No. 065574/'95, another internal clock generator is disclosed wherein the current mirror type primary stage circuits are disabled with the enabling signal φe of FIG. 9 at logic HIGH and a CMOS type primary stage circuit is rest enabled for watching a mode change while the SDRAM is controlled in a self-refresh mode, still decreasing its power consumption.

In these days, with increasing operational speed of the systems equipped with SDRAMs, the frequency of the system clock and operational speeds of peripheral circuits are increased. In the delay time between the external clock CLK 101 and the internal clock φ56 has become a problem for high speed operation, when data are read out from the SDRAM, for example.

As a solution of this problem, the phase angle of the internal clock is advanced from the phase angle of the external clock. FIG. 12 shows a block diagram of a heretofore known internal clock generator wherein an internal clock of an advanced phase is generated. In FIG. 12, an external clock CLK 101, a clock enabling signal CKE 102, first and second primary stage circuits 103, 104, and first and second control circuits 502, 508 correspond to parts having the same reference numerals in the circuit of FIG. 8 respectively, and generate the same first and second signals φ1, φ2 and the same control signal φ54 as the signals described in connection with FIG. 9 respectively.

In the prior art of FIG. 12, a timing compensation circuit 106 as such a PLL (phase-locked loop) for example, or a circuit proposed in a paper entitled "A 2.5 ns Clock Access 250 MHz 256 Mb SDRAM with a Synchronous Mirror Delay", by Saeki et al, ISSCC96/SESSION 23/DRAM/PAPER SP 23.4, February 1996, can be used when a continuous clock signal is not available to advance the phase angle of the first signal φ1 to produce a third signal φ3 phase-advanced. FIG. 13 is a waveform diagram illustrating waveforms of signals in the prior art of FIG. 12. Waveforms of the first, and second signals φ1, φ2, and the control signal φ54 are the same as the waveforms of the corresponding signals in FIG. 11. The phase of the third signal φ3 is advanced from the first signal φ1.

A second control circuit 508 suppresses the third signal φ3 while the control signal φ54 is at logic HIGH. Thus an internal clock with phase angle relatively advanced can be controlled with a clock enabling signal. But, when the phase angle is advanced more than π as in the example φ3 shown in FIG. 13, waveform of the output signal φ86 of the second control circuit 508 will be as shown by φ86 in FIG. 13. A narrow width rectangular waveform of the signal φ86 may produce errors and thus be detrimental to operation.

SUMMARY OF THE INVENTION

Therefore, a primary object of the invention is to provide an internal clock generator for a SDRAM, wherein a phase-advanced internal clock stably controlled with an asynchronous clock enabling signal, is obtained without being detrimental to operation thus providing a SDRAM which is easily applicable to a high-speed system.

In order to achieve the object, an internal clock generator of an embodiment comprises:

a first primary stage circuit for receiving an external clock signal and for producing a first signal synchronized to said external clock signal;

a second primary stage circuit for receiving a clock enabling signal and for producing a second signal synchronized to said clock enable signal;

a first control circuit for generating a control signal from said first and said second signals, said control signal becoming at logic HIGH with a first rising edge of said first signal during logic HIGH of said second signal and turning to logic LOW with a first rising edge of said first signal after turning to logic LOW of said second signal;

a timing compensation circuit for generating a phase compensated signal from said first signal, said phase compensated signal being a phase-advanced signal of said first signal; and a second control circuit for generating a phase-advanced internal clock from said phase compensated and said control signals, said phase-advanced internal clock being set and reset at each rising and falling edge of said phase compensated signal when said control signal is at logic LOW, and setting of said phase-advanced internal clock being inhibited when said control signal is at logic HIGH.

Therefore, a phase-advanced internal clock for a SDRAM without an error producing signal is obtained with a simple circuit configuration.

An internal clock generator of another embodiment of the invention comprises:

a first primary stage circuit for receiving an external clock signal and producing a first signal synchronized to said external clock signal;

a second primary stage circuit for receiving a clock enabling signal and producing a second signal synchronized to said clock enable signal;

a first control circuit for generating a control signal from said first and said second signals, said control signal becoming at logic HIGH with a first rising edge of said first signal during logic HIGH of said second signal and turning to logic LOW with a first rising edge of said first signal after turning to logic LOW of said second signal;

a third primary stage circuit for receiving said external clock signal and a power saving signal, said third primary stage circuit being enabled for producing a third signal synchronized to said external clock signal when said power saving signal is at logic LOW, and being disabled from maintainning said third signal at logic LOW when said power saving signal is at logic HIGH;

a fourth control circuit for generating a fourth signal from said first and said power saving signals, said fourth signal becoming at logic LOW with a first rising edge of said first signal during logic LOW of said power saving signal and turning to logic HIGH with a first rising edge of said first signal after turning to logic HIGH of said power saving signal;

a second control circuit for generating a fifth signal from said third and said fourth signals, said fifth signal being set and reset at each rising and falling edge of said third signal when said fourth signal is at logic LOW, and setting of said fifth signal being inhibited when said fourth signal is at logic HIGH;

a timing compensation circuit for generating a phase-compensated signal from said fifth signal, said phase-compensated signal being a phase-advanced signal of said fifth signal;

a selector for selecting as a timing signal one of said fifth signal and said phase-compensated signal according to a select signal; and a third control circuit for generating a phase-advaned internal clock from said control and said timing signals, said phase-advanced internal clock being set and reset at each rising and falling edge of said timing signal when said control signal is at logic LOW, and setting of said phase-advanced internal clock being inhibited when one of said control signal and said fourth signal is at logic HIGH.

Therefore, an internal clock generator which can generate a controllable phase-advanced internal clock in addition to an ordinary internal clock is realized in the present invention, wherein the effective clock periods of the internal clocks are elongated responsive to a clock enabling signal, resulting in a SDRAM of low dissipation which is easily applied to a high-speed system.

DESCRIPTION OF THE DRAWINGS

The foregoing, and further objects, features, and advantages of this invention will become apparent from a consideration of the following description, the appended claims, and the accompanying drawings in which the same numerals indicate the same or corresponding parts.

DETAILED DESCRIPTION OF THE PREFERRED EMBODIMENTS

Figure 1:
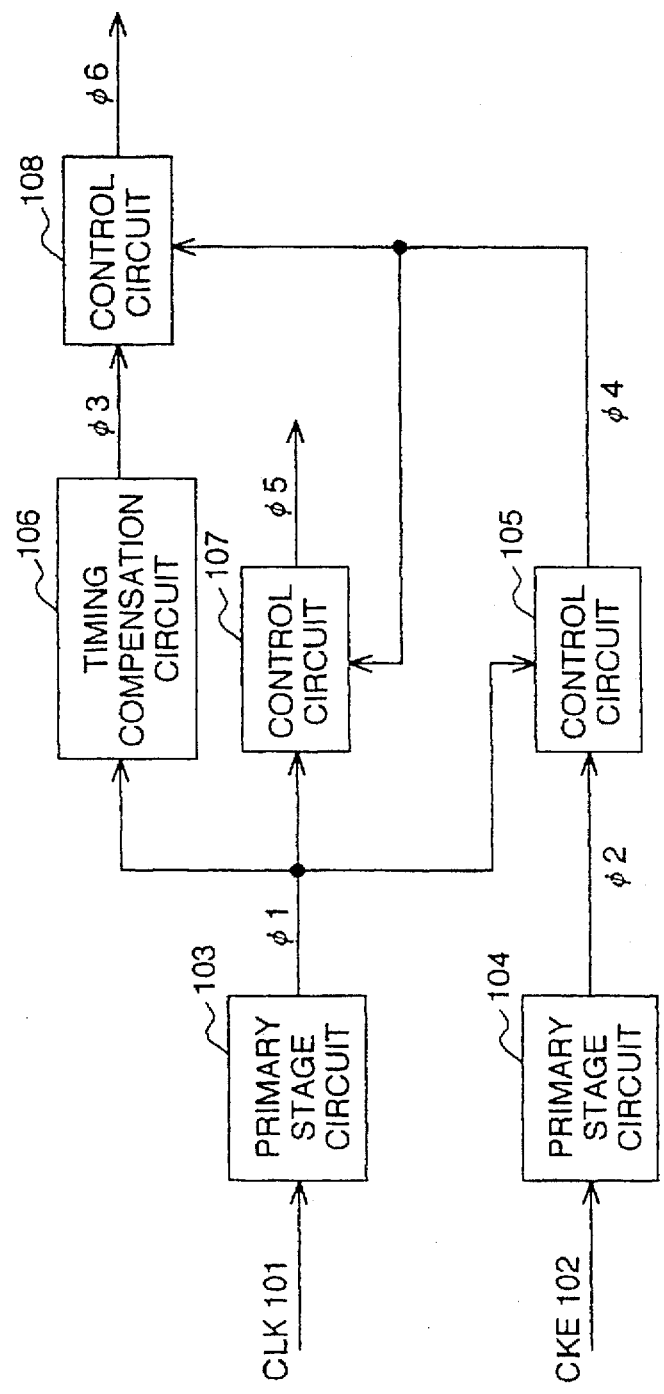
FIG. 1 is a block diagram illustrating a first embodiment of the invention.
Figure 12:
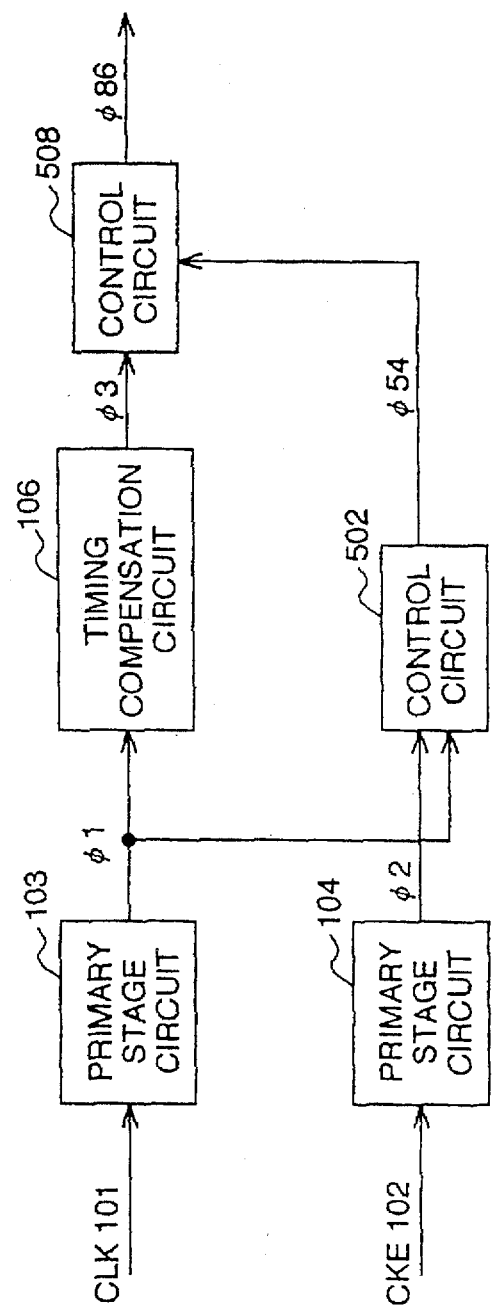
FIG. 12 is a block diagram illustrating other prior art.
Figure 13:
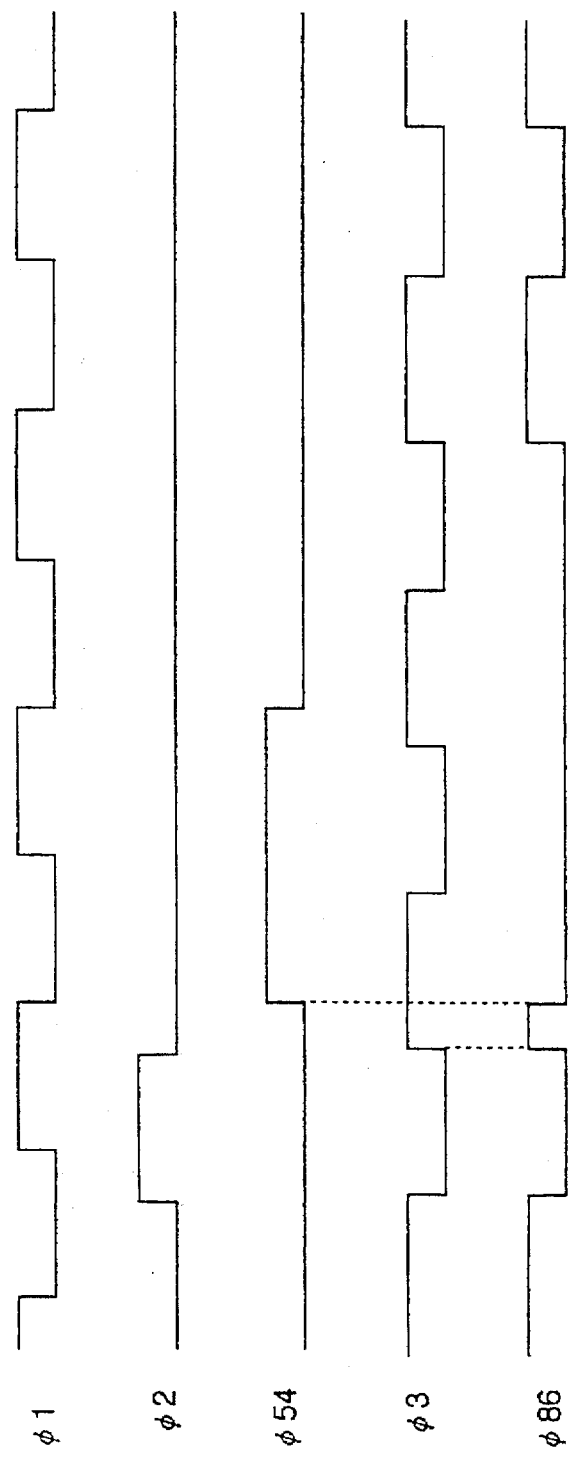
FIG. 13 is a waveform diagram of waveforms in the circuit of FIG. 12.

FIG. 1 is a block diagram of an embodiment of the present invention. An internal clock generator of FIG. 1 comprises first and a second primary stage circuits 103, 104, and a timing compensation circuit 106, each of which has the same circuit configuration as its corresponding circuit in FIG. 12 respectively, and produces the same first, second and third signals $\phi 1$, $\phi 2$, $\phi 3$ as shown in FIG. 13 from an external clock signal CLK 101 and a clock enable signal CKE 102.

Figure 2:
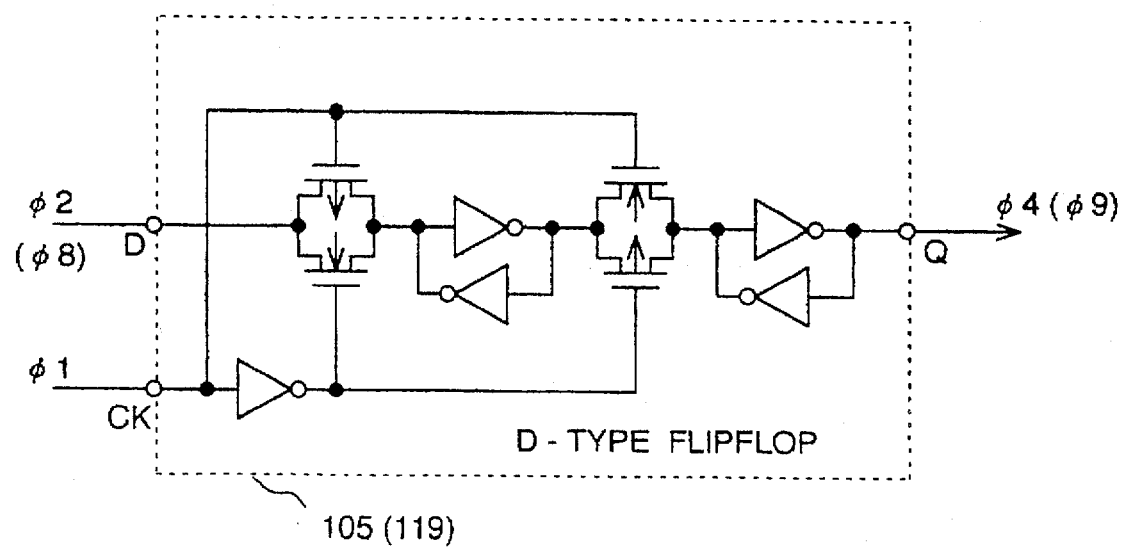
FIG. 2 is a circuit diagram of a control circuit consisting of a D-type flip-flop.

A first control circuit 105 consists of a D-type flipflop as shown in FIG. 2. At each rising edge of the first signal $\phi 1$, logic of the second signal $\phi 2$ is stored and held until the next rising edge of the first signal $\phi 1$. Thus a control signal $\phi 4$ as shown in FIG. 4 is produced at the output of the first control circuit 105.

Figure 3:
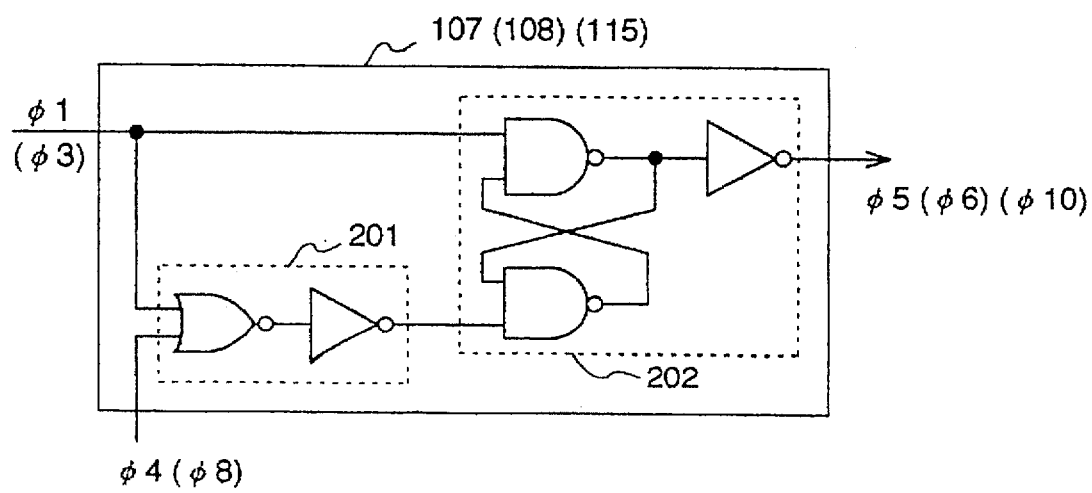
FIG. 3 is a circuit diagram of a control circuit comprising an RS-type flip-flop.

A second and a third control circuit 107 and 108 of FIG. 1 have a same circuit configuration as illustrated in FIG. 3, comprising an OR gate 201 supplied with the first and the control signals φ1 and φ4 and a RS-type flipflop 202 being set by the first signal φ1 and reset by the output of the OR gate 201. When the control signal φ4 is at logic LOW, it has no influence on the second control circuit 107, and setting and resetting are controlled by the rising and the falling edges of the first signal φ1 which arrives to reset terminal a little later than to set terminal of the RS-type flipflop 202 delayed by the OR gate 201. When the control signal φ4 is at logic HIGH, the output logic of the OR gate 201 is maintained at HIGH irrespective of the logic of the first signal φ1, inhibiting the setting of the flipflop 202.

Figure 4:
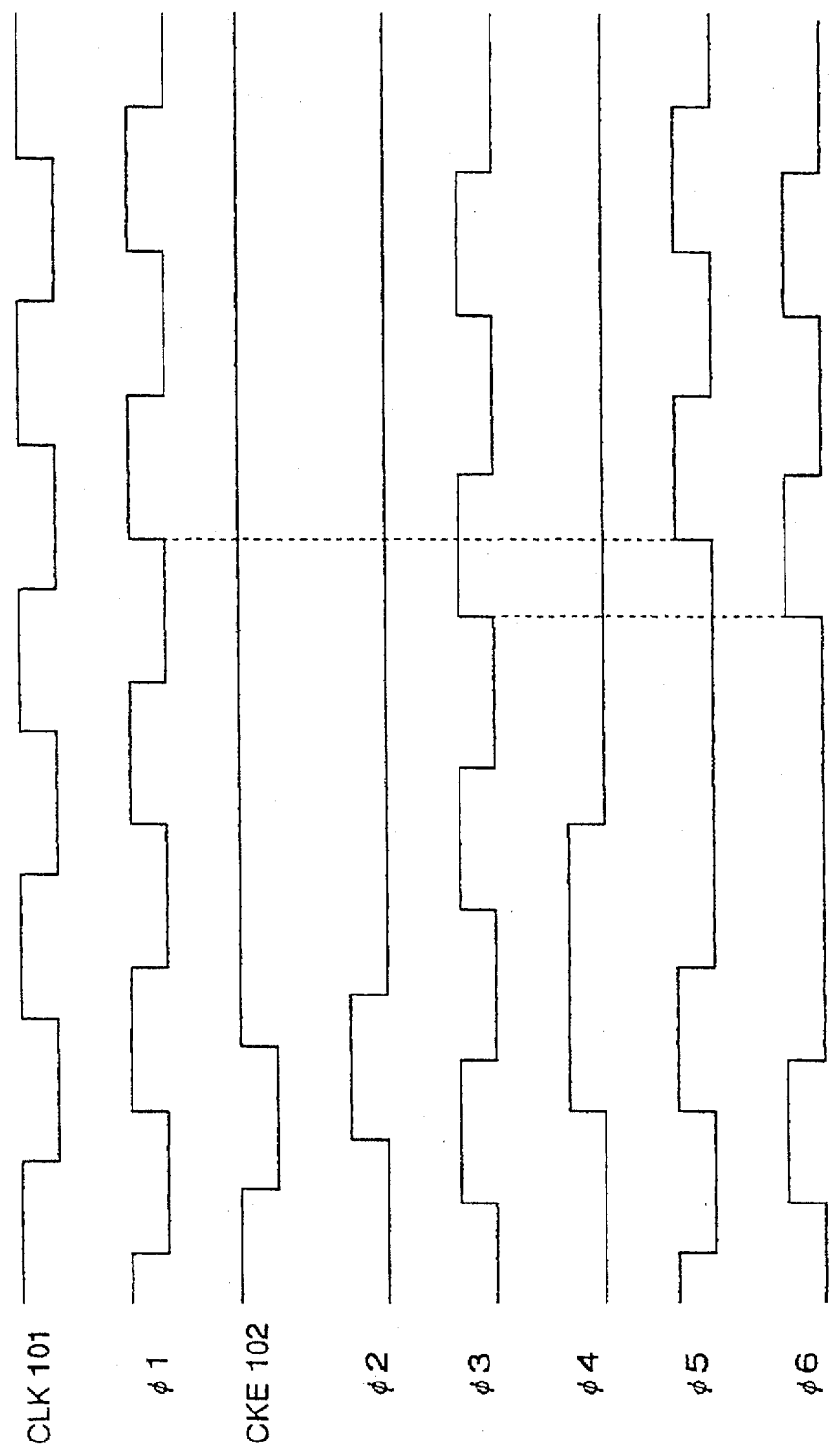
FIG. 4 is a waveform diagram of waveforms in the circuit of FIG. 1.

FIG. 4 is a waveform diagram of the waveforms in the circuit of FIG. 1. The rising edge of the control signal φ4 coincides with a rising edge of the first signal φ1, and the falling edge of the control signal φ4 coincides with the succeeding rising edge of the first signal φ1. The logic of the control signal φ4 is the same as the logic of the second signal φ2 at the corresponding rising edges of the first signal φ1.

The second control circuit 107 produces a first internal clock φ5 from the first and the control signals φ1 and φ4, and the third control circuit 108 produces a second internal clock φ6 from the third and the control signals φ3 and φ4. As seen from FIG. 4, the second internal clock φ6 is phase-advanced from the first internal clock φ5 for synchronizing output timing of data read out of the SDRAM, for example.

Now a second embodiment of the present invention is described.

Figure 5:
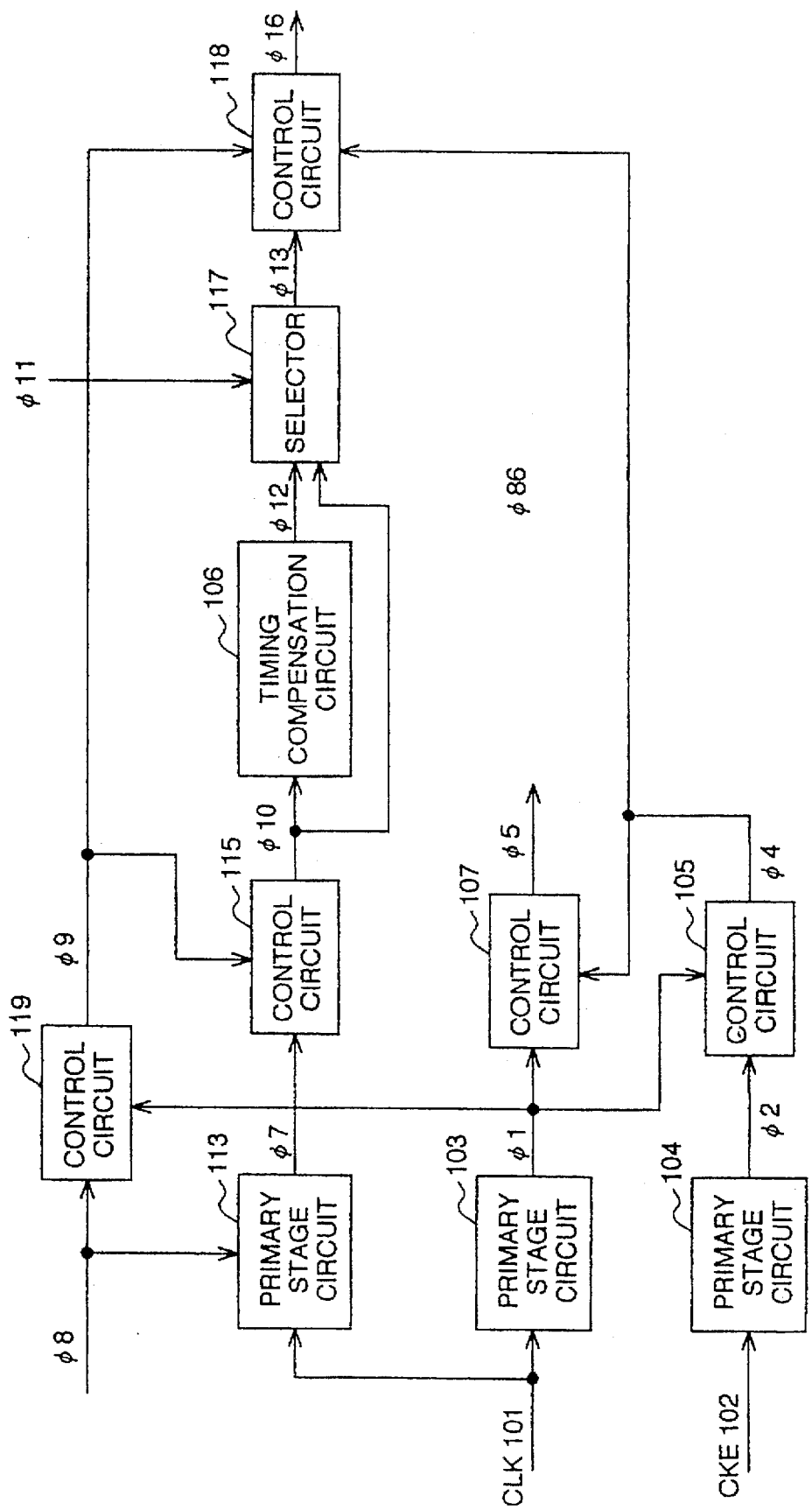
FIG. 5 is a block diagram illustrating a second embodiment of the invention.
Figure 7:
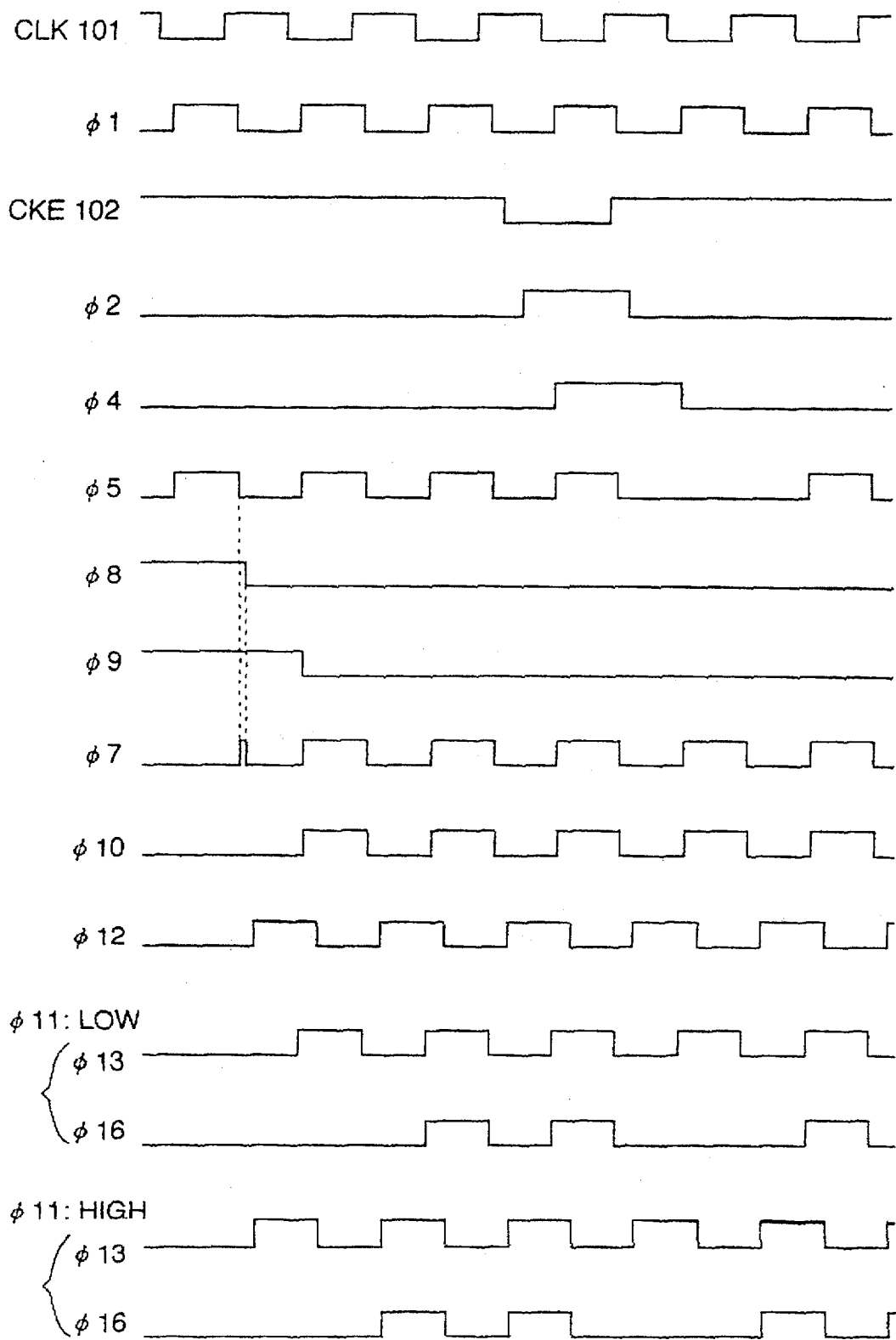
FIG. 7 is a waveform diagram of waveforms in the circuit of FIG. 5.
Figure 8:
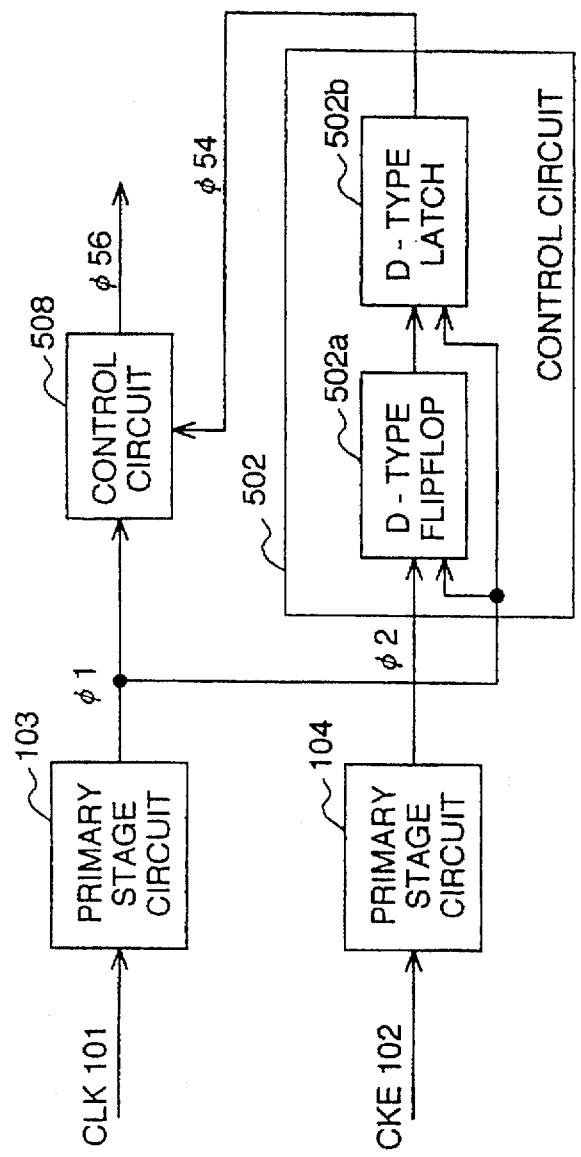
FIG. 8 is a block diagram illustrating prior art.

FIG. 5 is a block diagram of the second embodiment, wherein a select signal φ11 for selecting the phase of a second internal clock φ16, and a power saving signal φ8 for suppressing the second internal clock φ16, when unnesessary, are supplied. FIG. 7 is a waveform diagram of signals in the circuit of FIG. 5. Here, three sets of primary stage circuits and five sets of control circuits are provided. First and second primary stage circuits 103 and 104, and first and fifth control circuits 105 and 107 have the same configuration as the first and second primary stage circuits 103 and 104 and the first and second control circuits 105 and 107 of FIG. 1, and generates the same first, second and control signals φ1, φ2 and φ4 from an external clock signal CLK 101 and a clock enable signal CKE 102 in the same manner described in connection with FIG. 4.

Figure 9:
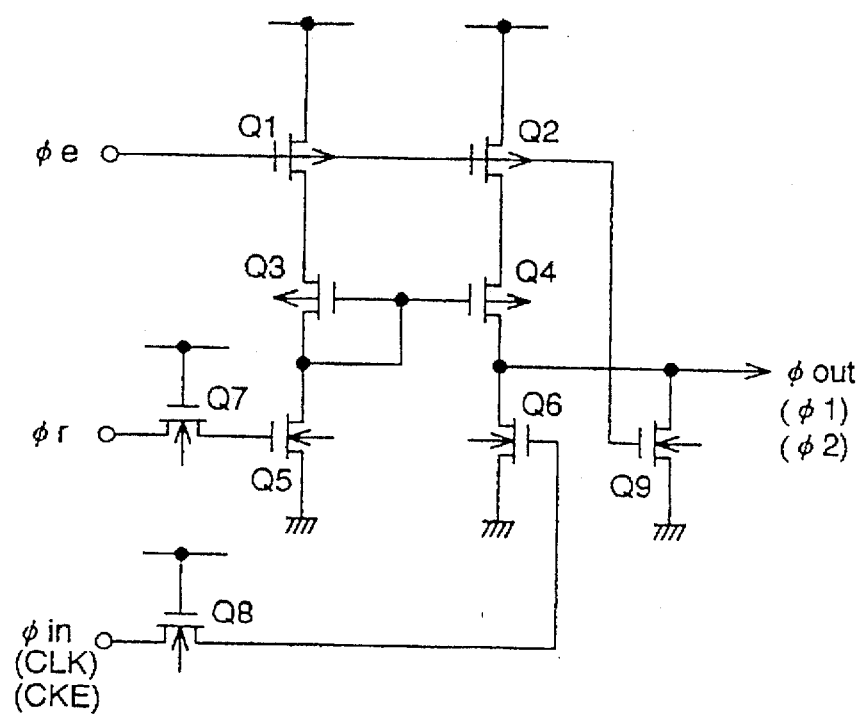
FIG. 9 is a circuit diagram of a prior art primary stage circuit.
Figure 10:
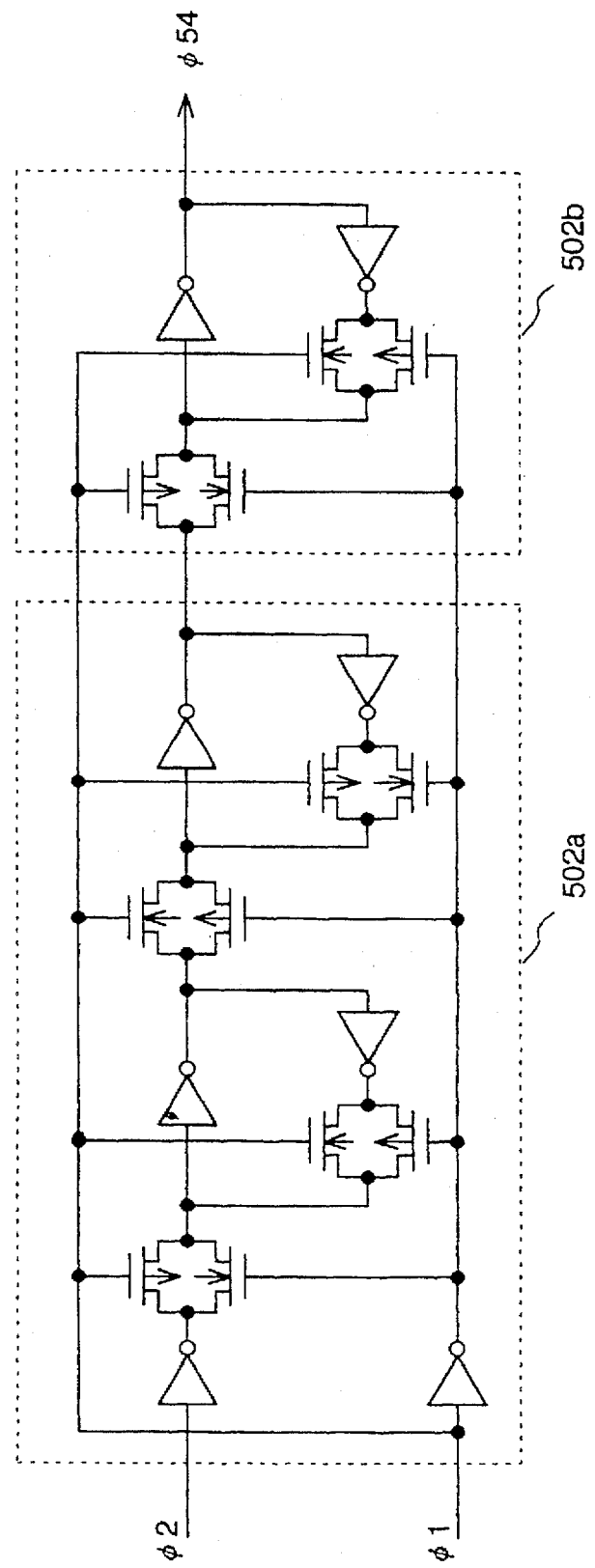
FIG. 10 is a circuit diagram of the control circuit of FIG. 8.
Figure 11:
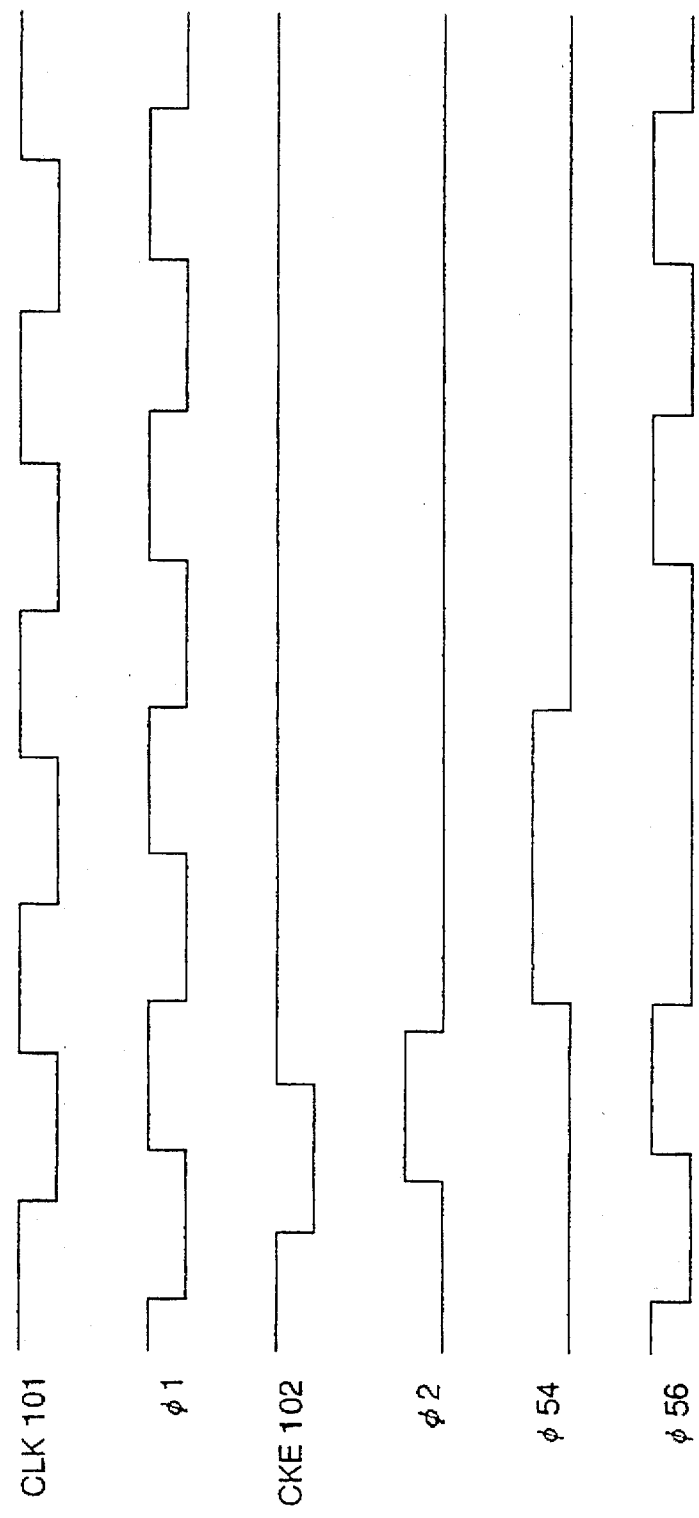
FIG. 11 is a waveform diagram of waveforms in the circuit of FIG. 8.

A third primary stage circuit 113 receives the power saving signal φ8 at its enabling input terminal φe (refer to FIG. 9). Since the power saving signal φ8 is independent of the external clock signal CLK 101, an output φ7 of the third primary stage circuit 113 may have an error producing waveform as shown by φ7 in FIG. 7. This waveform is eliminated by a second control circuit 115 having the same configuration as the control circuit of FIG. 3.

A fourth control circuit 119 has the same configuration as the first control circuit 105 consisting of a D-type flipflop as shown in FIG. 2. The power saving signal φ8 is delivered to the data input terminal and the first signal φ1 is delivered to the clock input terminal of the fourth control circuit 119. The output φ9 of the fourth control circuit 119 is shown by a waveform φ9 in FIG. 7, coincident with a rising edge of the first signal φ1.

The output φ10 of the second control circuit 115 is shown as a waveform φ10 in FIG. 7.

A timing compensation circuit 106 advances the phase angle of the output φ10 of the second control circuit 115 as shown in FIG. 7 for producing a phase compensated signal φ12.

Figure 6:
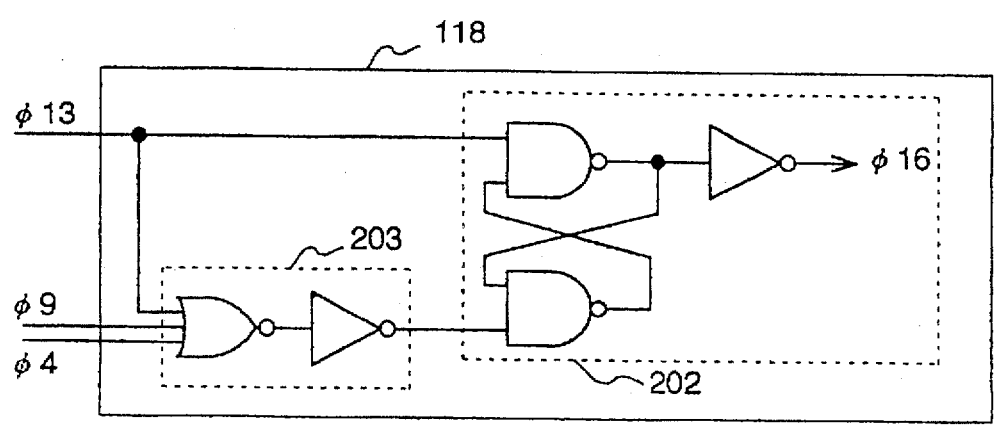
FIG. 6 is a circuit diagram of a control circuit 118 in FIG. 5.

A selector 117 selects the output φ10 of the second control circuit 115 or the phase compensated signal φ12 according to logic of the select signal φ11, to be a timing signal φ13 to be supplied to a third control circuit 118. The third control circuit 118, illustrated in FIG. 6 comprises a RS-type flipflop 202 with a reset terminal supplied from a three input OR gate 203. From the timing signal φ13, the control signal φ4 and the output φ9 of the fourth control circuit 119, the second internal clock φ16 shown in FIG. 7 is generated with no error producing waveform even through controlled by asynchronous signals, namely, the clock enable signal CKE 102, the power saving signal φ8 or the select signal φ11.

When the logic of the select signal φ11 is HIGH, the phase compensated signal φ12 is selected as the timing signal φ13 and the phase of the second internal clock φ16 is advanced as shown in FIG. 7. In the case where the phase-advanced internal clock does not match with an output device, for example, the select signal φ11 is controlled to logic LOW for the selector 117 for selecting the output φ10 of the second control circuit 115 to be the timing signal φ13, and the phase of the second internal clock φ16 is put back to the phase of the first internal clock φ5.

When the second internal clock φ16 is not necessary, i.e. when the SDRAM is controlled by the clock enable signal CKE 102 for out-putting stored data to a low speed device for example, the power saving signal φ8 is controlled at logic HIGH to disable the current mirror of the third primary stage circuit 113, eliminating unnecessary dissipation.

Thus, an internal clock generator which can generate a controllable phase-advanced internal clock in addition to an ordinary internal clock is realized in the second embodiment, wherein effective clock periods of the internal clocks are elongated responsive to a clock enabling signal, resulting in a SDRAM of low dissipation which is easily applied to a high-speed system.

What is claimed is:

1. An internal clock generator for a synchronous dynamic RAM comprising:

a first primary stage circuit for receiving an external clock signal and producing a first signal synchronized to said external clock signal;

a second primary stage circuit for receiving a clock enabling signal and producing a second signal synchronized to said clock enable signal;

a first control circuit for generating a control signal from said first signal and said second signal, said control signal becoming logic HIGH with a first rising edge of said first signal during logic HIGH of said second signal and turning to logic LOW with a next first rising edge of said first signal after turning to logic LOW of said second signal;

a timing compensation circuit for generating a phase compensated signal from said first signal, said phase compensated signal being a phase-advanced signal of said first signal; and a second control circuit for generating a phase-advanced internal clock from said phase compensated signal and said control signal, said phase-advanced internal clock being set and reset, respectively, at each rising and falling edges of said phase compensated signal when said control signal is at logic LOW and setting of said phase-advanced internal clock being inhibited when said control signal is at logic HIGH.

2. An internal clock generator as recited in claim 1, wherein said first control circuit comprises a D-type flipflop, a data terminal of said D-type flipflop being coupled to receive said second signal and a clock terminal of said D-type flipflop being coupled to receive said first signal.

3. An internal clock generator as recited in claim 1, wherein said second control circuit comprises an RS-type flipflop, a set terminal of said RS-type flipflop being coupled to receive said phase compensated signal and a reset terminal of said RS-type flipflop being coupled to receive an OR logic of said phase compensated signal and said control signal.

4. An internal clock generator for a synchronous dynamic RAM comprising:

a first primary stage circuit for receiving an external clock signal and producing a first signal synchronized to said external clock signal;

a second primary stage circuit for receiving a clock enabling signal and producing a second signal synchronized to said clock enabling signal;

a first control circuit for generating a control signal from said first signal and said second signal, said control signal becoming logic HIGH with a first rising edge of said first signal during logic HIGH of said second signal and turning to logic LOW with a next first rising edge of said first signal after turning to logic LOW of said second signal;

a third primary stage circuit, coupled to receive said external clock signal and a power-saving signal, said third primary stage circuit being enabled to produce a third signal synchronized to said external clock signal when said power saving signal is at logic LOW and maintaining said third signal at logic LOW when said power saving signal is at logic HIGH;

a fourth control circuit for generating a fourth signal from said first signal and said power saving signal, said fourth signal becoming logic LOW with a second rising edge of said first signal during logic LOW of said power saving signal and turning to logic HIGH with a third rising edge of said first signal after turning to logic HIGH of said power saving signal;

a second control circuit for generating a fifth signal from said third signal and said fourth signal, said fifth signal being set and reset, respectively, at each rising and falling edge of said third signal when said fourth signal is at logic LOW and setting of said fifth signal being inhibited when said fourth signal is at logic HIGH;

a timing compensation circuit for generating a phase-compensated signal from said fifth signal, said phase-compensated signal being a phase-advanced signal of said fifth signal;

a selector for selecting as a timing signal one of said fifth signal and said phase-compensated signal according to a select signal; and a third control circuit for generating a phase-advanced internal clock from said control signal, said fourth signal and said timing signal, said phase-advanced internal clock being set and reset, respectively, at each rising and falling edge of said timing signal when said control signal is at logic LOW and setting of said phase-advanced internal clock being inhibited when one or both of said control signal and said fourth signal is at logic HIGH.

5. An internal clock generator as recited in claim 4, wherein said second control circuit comprises an RS-type flipflop, a set terminal of said RS-type flipflop being coupled to receive said third signal and a reset terminal of said RS-type flipflop being coupled to receive an OR logic of said third signal and said fourth signal.

6. An internal clock generator as recited in claim 4, wherein said third control circuit comprises an RS-type flipflop, a set terminal of said RS-type flipflop being coupled to receive said timing signal and a reset terminal of said RS-type flipflop being coupled to receive an OR logic of said control signal, said fifth signal and said timing signal.

7. An internal clock generator as recited in claim 4, wherein said first control circuit is comprised of a D-type flipflop, a data terminal of said D-type flipflop being coupled to receive said second signal and a clock terminal of said D-type flipflop being coupled to receive said first signal.

8. An internal clock generator as recited in claim 4, wherein said fourth control circuit is comprised of a D-type flipflop, a data terminal of said D-type flipflop being coupled to receive said power saving signal and a clock terminal of said D-type flipflop being coupled to receive said first signal.

* * * * *